United States Patent

Sakaguchi

(10) Patent No.: US 8,922,188 B2
(45) Date of Patent: Dec. 30, 2014

(54) LOW PASS FILTER CIRCUIT AND VOLTAGE REGULATOR

(71) Applicant: Seiko Instruments Inc., Chiba-shi, Chiba (JP)

(72) Inventor: Kaoru Sakaguchi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 81 days.

(21) Appl. No.: 13/779,253

(22) Filed: Feb. 27, 2013

(65) Prior Publication Data

US 2013/0234688 A1    Sep. 12, 2013

(30) Foreign Application Priority Data

Mar. 12, 2012  (JP) .................................. 2012-054844

(51) Int. Cl.
*G05F 1/00*   (2006.01)
*H03H 11/12*  (2006.01)
*G05F 1/10*   (2006.01)

(52) U.S. Cl.
CPC ............. *H03H 11/1213* (2013.01); *G05F 1/10* (2013.01)
USPC ........................................................ 323/286

(58) Field of Classification Search
USPC ......... 323/234, 237, 273, 274, 277, 281, 282, 323/284, 286
See application file for complete search history.

(56) References Cited

U.S. PATENT DOCUMENTS

| | | | |
|---|---|---|---|
| 7,397,226 B1 | 7/2008 | Mannama et al. | |
| 8,477,159 B2* | 7/2013 | Ichikura | ........................ 345/690 |
| 2010/0007428 A1* | 1/2010 | Nezuka | ........................ 331/36 C |
| 2010/0329157 A1* | 12/2010 | Xing et al. | ..................... 370/278 |
| 2011/0032647 A1* | 2/2011 | Kawachi | ........................ 361/56 |

FOREIGN PATENT DOCUMENTS

JP         05-127761 A        5/1993

\* cited by examiner

*Primary Examiner* — Adolf Berhane
*Assistant Examiner* — Jeffrey Gblende
(74) *Attorney, Agent, or Firm* — Brinks Gilson & Lione

(57) ABSTRACT

Provided are a low pass filter circuit having a small output voltage shift caused by a substrate leakage current at high temperature, and a voltage regulator using the low pass filter circuit, which has a small output voltage shift at high temperature. In a low pass filter circuit using a PMOS transistor as a resistive element, a back gate terminal of the PMOS transistor is set to have a higher voltage than a source of the PMOS transistor. Further, in a voltage regulator incorporating the low pass filter circuit to an output of a reference voltage circuit, the voltage of the back gate terminal of the PMOS transistor which is higher than that of the source thereof is generated by the reference voltage circuit.

4 Claims, 4 Drawing Sheets

LOW PASS FILTER CIRCUIT AND VOLTAGE REGULATOR

RELATED APPLICATIONS

This application claims priority under 35 U.S.C. §119 to Japanese Patent Application No. 2012-054844 filed on Mar. 12, 2012, the entire content of which is hereby incorporated by reference.

BACKGROUND OF THE INVENTION

1. Field of the Invention

The present invention relates to a low pass filter circuit in a semiconductor integrated circuit, and a voltage regulator including the low pass filter circuit.

2. Description of the Related Art

In an electronic device equipped with a high frequency circuit or a wireless device, a low noise power supply is required, and hence a low-dropout (LDO) voltage regulator having good noise characteristics is used. Primary factors of output noise of the voltage regulator include 1/f noise generated in an internal reference voltage circuit and resistor thermal noise generated in a resistor voltage dividing circuit for determining an output voltage. In recent years, following the demand for extended operating time of mobile electronic devices, there is an increasing tendency to use a CMOS transistor integrated circuit having smaller current consumption than a bipolar transistor integrated circuit. However, it is known that the CMOS transistor circuit has larger 1/f noise than the bipolar transistor circuit. It is therefore required to suppress noise of a voltage regulator in the CMOS transistor circuit. It is generally considered that the 1/f noise depends on an interfacial effect in a channel of a MOS transistor, and the 1/f noise is large in a low frequency region. In order to obtain a lower noise voltage, it has been known to use a configuration in which a low pass filter circuit is connected to an output of an internal reference voltage circuit (see Japanese Patent Application Laid-open No. Hei 05-127761). However, the 1/f noise is large in a low frequency region, and hence, in order to sufficiently suppress noise by the low pass filter circuit, it is necessary to set a cutoff frequency to be very low, for example, about several Hz to several tens of Hz.

First, a conventional low pass filter circuit is described. FIG. 4 is a diagram illustrating a voltage regulator including the conventional low pass filter circuit.

The voltage regulator including the conventional low pass filter circuit includes a ground terminal 100, a power supply terminal 101, an output terminal 102, a low pass filter circuit 403, an amplifier 105, an output transistor 106, and a reference voltage generation circuit 407 (see, for example, U.S. Pat. No. 7,397,226).

Next, the operation of the voltage regulator including the conventional low pass filter circuit is described.

In the reference voltage generation circuit 407, an amplifier 104 controls a voltage of a gate terminal of a PMOS transistor 120 so that an output voltage Vref of a reference voltage source 108 and a divided voltage Vfb obtained by dividing the output voltage Vref by resistors 151 and 152 are equal to each other. Vfb and Vref are equal to each other, and hence, when the resistance values of the resistor 151 and 152 are represented by R1 and R2, respectively, a voltage Vref2 of a drain terminal of the PMOS transistor 120 is determined by a voltage dividing ratio of R1 and R2 as expressed by Expression (1)

$$Vref2=Vref \cdot (R1+R2)/R2 \qquad (1)$$

In general, in an integrated circuit, the fluctuations in absolute value of resistive elements are large. However, the resistance ratio can be set relatively accurately, and hence, by adjusting the resistance ratio of the resistors 151 and 152, the voltage Vref2 can be accurately set to an arbitrary value. A voltage of an input terminal 112 and a voltage of an output terminal 113 of the low pass filter circuit 403 are equal to each other in the steady state, and hence a voltage of the an inverting input terminal of the amplifier 105 is equal to the reference voltage Vref2.

The amplifier 105 controls a voltage of a gate terminal of the output transistor 106 so that the voltage of the output terminal 113 of the low pass filter circuit 403 and a voltage Vout of the output terminal 102 of the voltage regulator are equal to each other. Therefore, the output voltage Vout becomes equal to Vref2. As described above, Vref2 is determined by the resistance ratio of the resistors 151 and 152, and hence the output voltage Vout can be arbitrarily adjusted through the adjustment of the resistance ratio of the resistors.

Next, the operation of the low pass filter circuit is described. A current source 111 is designed so as to cause a very small current I1 of, for example, about sub-nA to several nA, to flow. The current I1 is equal to a drain current of a PMOS transistor 122, and hence the PMOS transistor 122 operates in the weak inversion region and has a very large ON-state resistance of, for example, about several hundreds of MΩ. An ON-state resistance Ron of a PMOS transistor 121 which is current-mirror connected to the PMOS transistor 122 is similarly very large. Thus, a cutoff frequency fc of a low pass filter determined by the ON-state resistance Ron and a capacitor 161 is very low.

The low pass filter circuit 403 suppresses 1/f noise which is contained in the reference voltage Vref2 and generated in the reference voltage generation circuit 407 and thermal noise which is generated in the resistor voltage dividing circuit of the resistors 151 and 152. Thus, smaller noise appears in the output terminal 102. Therefore, a voltage regulator with small output noise can be obtained.

In the voltage regulator including the conventional low pass filter circuit, at high temperature, the output voltage shifts due to a substrate leakage current of the PMOS transistor.

In the PMOS transistor, parasitic diodes are formed between p-type conductive source, channel, and drain regions and an n-type conductive well. Then, a thermo-stimulated current flows in the forward direction of the diodes. The thermo-stimulated current increases exponentially with an increase in temperature, and hence the forward current becomes larger at a higher temperature. In the PMOS transistor, holes flow into the n-type conductive well due to the forward current. The holes flowing into the n-type conductive well flow to the ground via a parasitic reverse diode formed between the well and a p-type conductive substrate, or alternatively the holes are recombined with electrons as major carriers in the n-type conductive well and disappear to generate a recombination current, which becomes a substrate leakage current in total. In particular, when the PMOS transistor is operated in the weak inversion region in order to reduce a cutoff frequency of the low pass filter circuit enough, a potential difference between the channel region and the well becomes smaller than a potential difference between the source and the well, and hence the substrate leakage current from the channel region increases. In the conventional circuit, the potential of the input terminal of the low pass filter, that is, the source potential of the PMOS transistor of the low pass filter is controlled to be constant. However, when a leakage current flows from the channel region, the potentials of the channel and the drain are decreased. When the drain potential decreases, the output voltage of the low pass filter circuit decreases, and hence the output voltage of the voltage regulator also decreases along with the operation of the voltage regulator.

The mechanism for holes has been described above, but the same holds true for electrons.

SUMMARY OF THE INVENTION

In order to solve the conventional problem, according to the present invention, a back gate terminal of a PMOS transistor in a low pass filter circuit is fixed to a potential higher than a source of the PMOS transistor. Further, in a voltage regulator incorporating the low pass filter circuit, the back gate terminal potential is generated by an existing reference voltage circuit or voltage dividing circuit.

According to the voltage regulator including the low pass filter circuit of the present invention, a leakage current in the low pass filter circuit at high temperature is small, and hence the accuracy of an output voltage under a high temperature environment is improved as compared with conventional one. Further, according to the present invention, the back gate potential of the PMOS transistor in the low pass filter circuit is generated by an existing circuit provided in a low noise voltage regulator circuit, and hence it is unnecessary to provide a dedicated circuit for generating the back gate potential. Thus, the chip area of an IC is hardly increased, and the manufacturing cost is not increased.

DETAILED DESCRIPTION OF THE PREFERRED EMBODIMENTS

Figure 1:
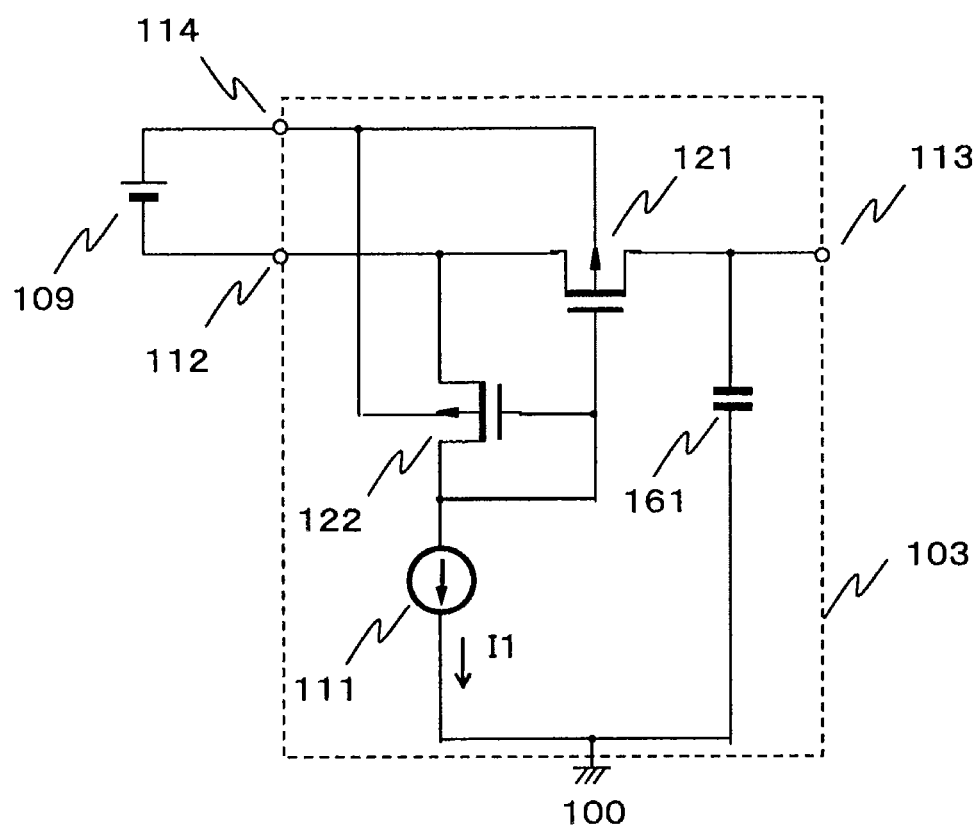
FIG. 1 is a circuit diagram illustrating a low pass filter circuit according to an embodiment of the present invention.

FIG. 1 is a diagram illustrating a low pass filter circuit according to the present invention.

A low pass filter circuit 103 according to the present invention includes PMOS transistors 121 and 122, a current source 111, a capacitor 161, an input terminal 112, a back gate input terminal 114, and an output terminal 113.

The PMOS transistors 121 and 122 each have a source terminal connected to the input terminal 112, a substrate terminal connected to the back gate input terminal 114, and a gate terminal connected to one terminal of the current source 111 and to a drain terminal of the PMOS transistor 122. The other terminal of the current source 111 is connected to a ground terminal 100. The PMOS transistor 121 has a drain terminal connected to the output terminal 113 and to one terminal of the capacitor 161. The other terminal of the capacitor 161 is connected to the ground terminal.

Further, a back gate voltage source 109 is connected between the input terminal 112 and the back gate input terminal 114.

The present invention is different from the conventional technology in that the back gate terminals of the PMOS transistors 121 and 122 are higher in potential than the source terminals.

Under the conditions of strong inversion operation of the PMOS transistor 121, a p-type conductive channel region is formed. The probability P that holes in the channel region are thermally excited by thermal energy to flow into an n-type conductive well is given approximately by Expression (2) below.

$$P = P0 \cdot \exp\{-Vcw/(Kb \cdot T)\} \tag{2}$$

where P0 represents a normalization constant, T represents temperature, Kb represents the Boltzmann constant, and Vcw represents a potential difference between the channel and the n-type conductive well. From Expression (2), the probability of thermal excitation becomes higher at a higher temperature and a lower Vcw, and a leakage current becomes larger in proportion to the probability P of Expression (2). In the circuit of the present invention, Vcw between the channel and the n-type conductive well is large, and hence the leakage current is small. When the leakage current is small, almost no potential difference is generated between input and output terminals of a low pass filter circuit. Thus, an effect that almost no shift occurs in output voltage of the low pass filter circuit can be obtained.

Further, although not illustrated, in order to prevent a noise signal from propagating from the voltage source 109 to the output terminal 113, a resistor or a low pass filter circuit may be connected between the voltage source 109 and the back gate terminal of the PMOS transistor 121.

Figure 2:
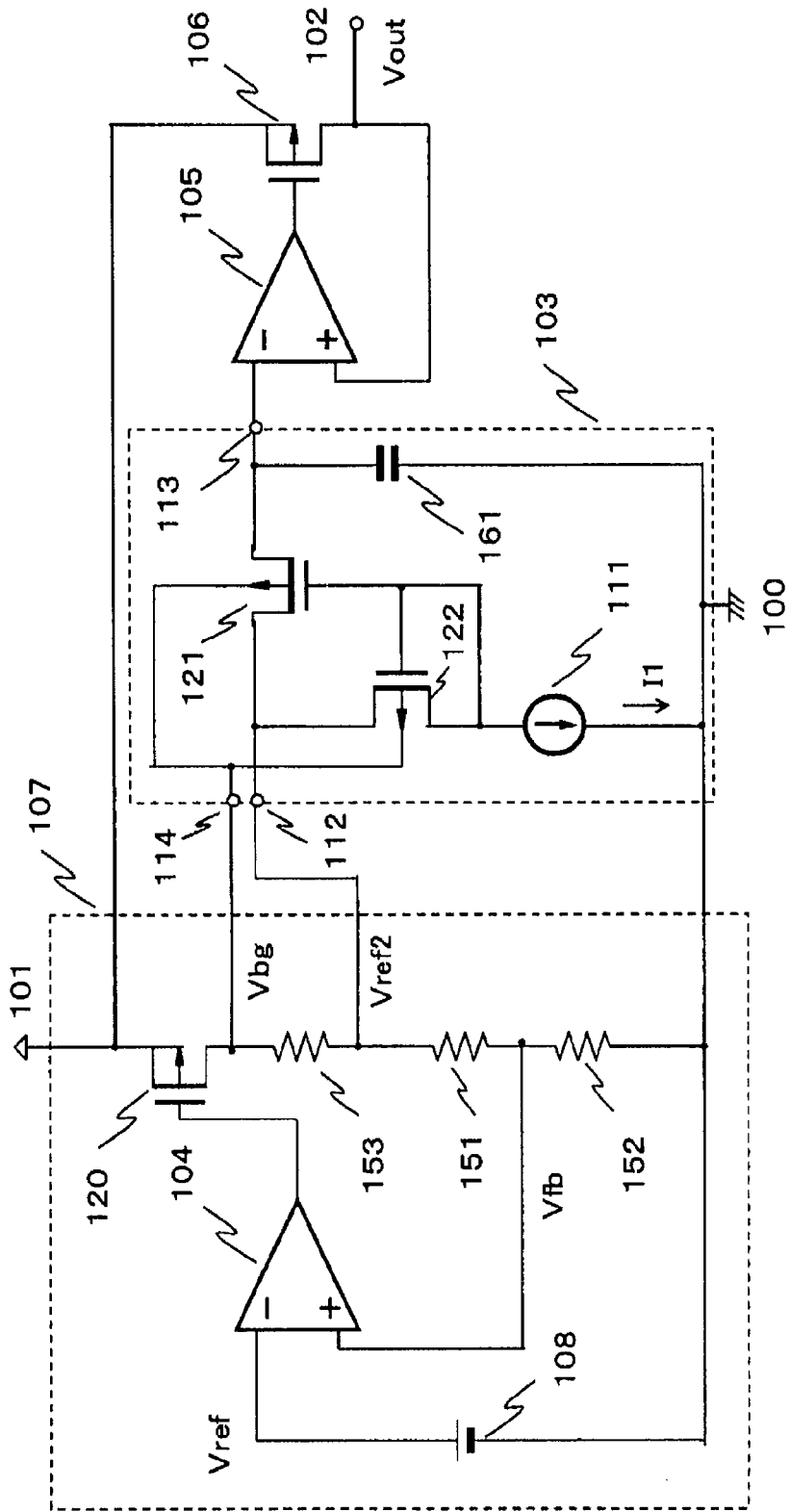
FIG. 2 is a circuit diagram illustrating a voltage regulator including the low pass filter circuit according to the embodiment of the present invention.

FIG. 2 is a circuit diagram illustrating a voltage regulator including the above-mentioned low pass filter circuit according to an embodiment of the present invention.

The voltage regulator according to the embodiment of the present invention includes the ground terminal 100, a power supply terminal 101, an output terminal 102, the low pass filter circuit 103, an amplifier 105, an output transistor 106, and a reference voltage generation circuit 107.

The reference voltage generation circuit 107 includes a reference voltage source 108, an amplifier 104, a PMOS transistor 120, and resistors 151, 152, and 153. The PMOS transistor 120 has a source connected to the power supply terminal 101 and a drain connected to one terminal of the resistor 153. The other terminal of the resistor 153 is connected in series to the resistor 151. The resistor 151 is grounded via the resistor 152 which is further connected in series. A node between the resistor 153 and the resistor 151 is connected to the input terminal 112 of the low pass filter circuit 103, and a node between the PMOS transistor 120 and the resistor 153 is connected to the input terminal 114 of the low pass filter circuit 103.

In this case, a voltage generated across the resistor 153 corresponds to a source-back gate terminal voltage of the PMOS transistors 121 and 122 in the low pass filter circuit 103.

The use of the configuration of the voltage regulator in this embodiment can suppress the leakage current of the low pass filter circuit at high temperature, thus preventing the decrease in output voltage of the low noise voltage regulator. Further, the back gate potential of the PMOS transistor of the low pass filter circuit is generated by resistor division in the reference voltage generation circuit 107. Thus, it is unnecessary to add a dedicated circuit for generating the back gate voltage, and hence the increase in chip area can be suppressed, which does not affect manufacturing cost.

Figure 3:
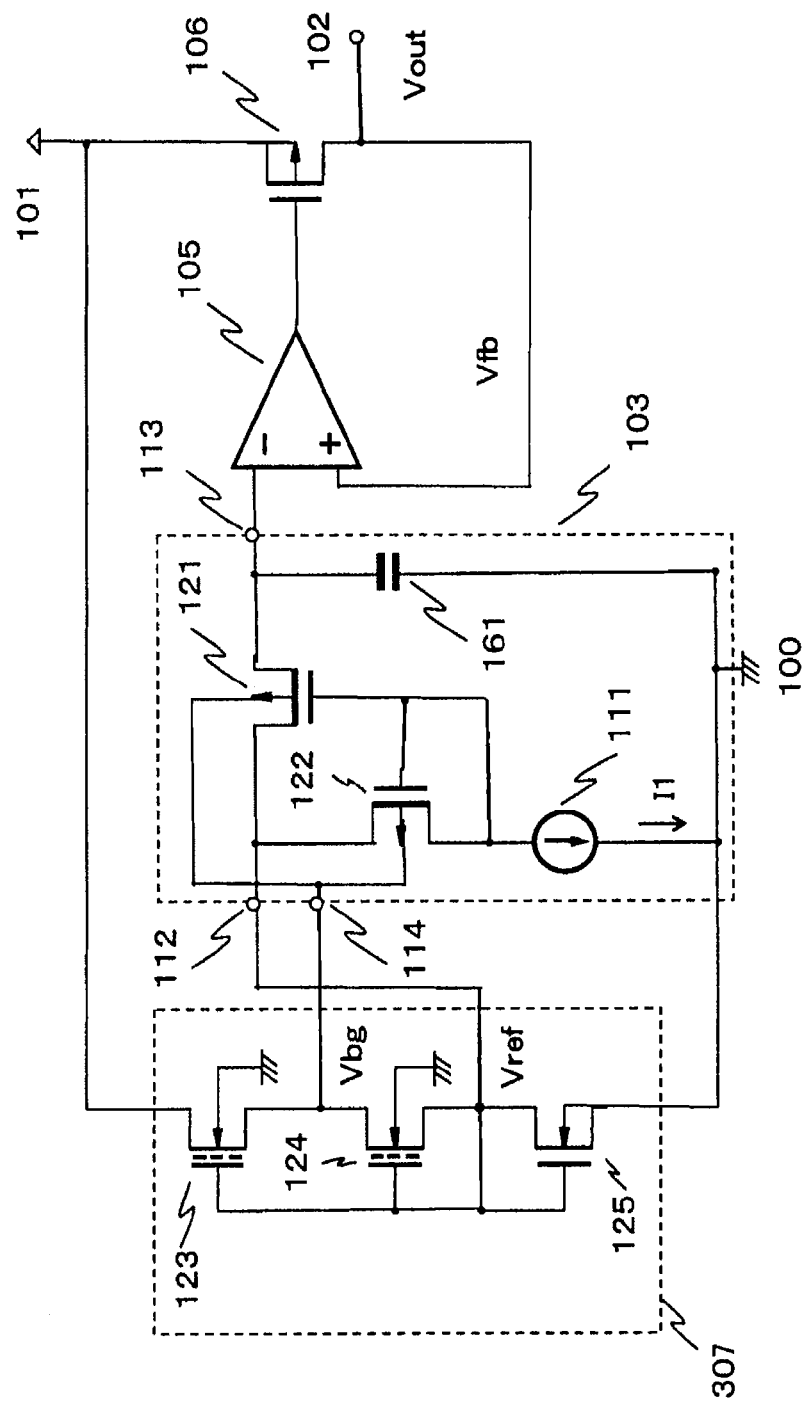
FIG. 3 is a circuit diagram illustrating anther voltage regulator including a low pass filter circuit according to the embodiment of the present invention.
Figure 4:
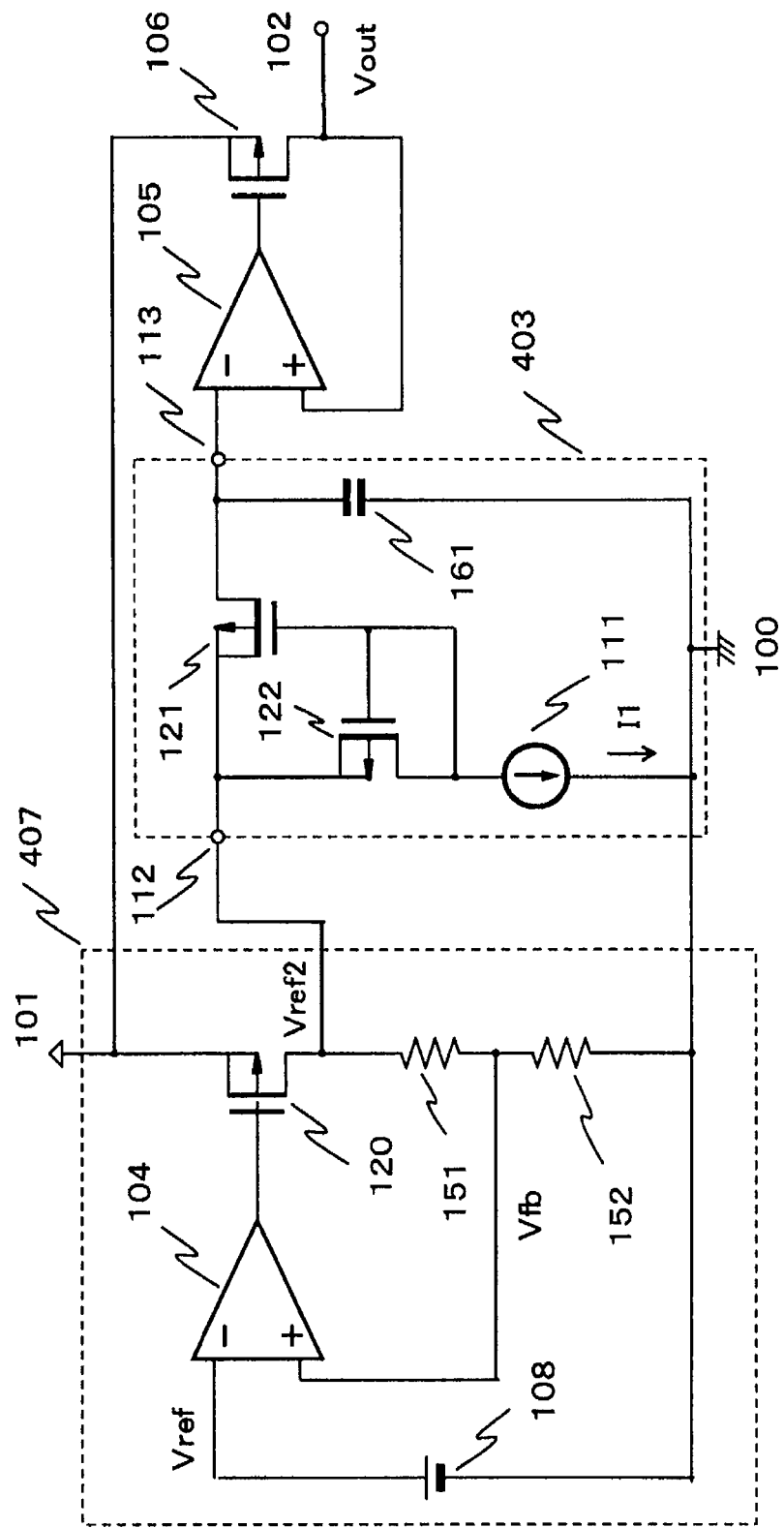
FIG. 4 is a circuit diagram illustrating a voltage regulator including a conventional low pass filter circuit.

FIG. 3 is a circuit diagram illustrating a voltage regulator including a low pass filter circuit according to a second embodiment of the present invention.

The voltage regulator according to the second embodiment includes the low pass filter circuit 103, the amplifier 105, the output transistor 106, and a reference voltage generation circuit 307. The reference voltage generation circuit 307 is an ED type reference voltage circuit, and includes NMOS depletion transistors 123 and 124 and an NMOS enhancement transistor 125.

Description is given of connections in the reference voltage generation circuit 307.

The NMOS enhancement transistor 125 has a source terminal connected to the ground terminal, and a gate terminal and a drain terminal connected to the input terminal 112 of the low pass filter circuit 103. The NMOS depletion transistor 124 has a source terminal and a gate terminal connected to the drain terminal of the NMOS enhancement transistor 125 and to a gate terminal of the NMOS depletion transistor 123. The NMOS depletion transistor 124 has a drain terminal connected to a source terminal of the NMOS depletion transistor 123 and to the back gate input terminal 114 of the low pass filter circuit 103. The NMOS depletion transistor 123 has a drain terminal connected to the power supply terminal 101.

The feature of the voltage regulator according to the second embodiment is described.

A potential difference generated across the NMOS depletion transistor 124 corresponds to a source-back gate terminal voltage of the PMOS transistors in the low pass filter circuit 103. In this case, the series-connected NMOS depletion transistors 123 and 124 are originally formed of a single element, if those transistors are not intended to be connected to the back gate input terminal 114. Therefore, the element layout is different because the elements are divided, which however hardly contributes to an increased chip area.

In the ED type reference voltage circuit, 1/f noise is generated in the NMOS enhancement transistor and the NMOS depletion transistors, which is a primary factor of output noise of the voltage regulator. The configuration of FIG. 3 can suppress the 1/f noise by the low pass filter circuit 103.

What is claimed is:

1. A low pass filter circuit comprising:
a first PMOS transistor;
a second PMOS transistor;
a capacitor;
a back gate voltage source connected between a back gate terminal and an input terminal of the low pass filter circuit; and
a current source,
the first PMOS transistor including a source connected to the input terminal, a drain connected to an output terminal of the low pass filter circuit, and a gate connected to one terminal of the current source,
the second PMOS transistor including a source connected to the input terminal, and a gate and a drain connected to the one terminal of the current source,
the capacitor being connected between the output terminal and a ground terminal,
the current source having another terminal grounded,
the first PMOS transistor and the second PMOS transistor connected to the back gate terminal and having the same substrate potential which is higher than a source potential of the first PMOS transistor and the second PMOS transistor,
wherein a voltage at the back gate terminal is higher than that of the ground terminal by a predetermined amount.

2. A voltage regulator comprising:
a reference voltage generation circuit;
an amplifier;
an output transistor; and
the low pass filter circuit according to claim 1,
the reference voltage generation circuit including the back gate voltage source and configured to generate a first reference voltage and a second reference voltage higher than the first reference voltage,
the low pass filter circuit including the input terminal to which the first reference voltage is input, and the output terminal connected to a first input terminal of the amplifier,
the output transistor including a gate connected to an output terminal of the amplifier, a source connected to a power source, and a drain connected to an output terminal of the voltage regulator and to a second input terminal of the amplifier,
the second reference voltage being connected to a substrate of each of the first PMOS transistor and the second PMOS transistor.

3. A voltage regulator according to claim 2, wherein the reference voltage generation circuit includes a plurality of resistors connected in series, and wherein one of the plurality of resistors comprises the back gate voltage source and the first reference voltage and the second reference voltage are output from the plurality of resistors.

4. A voltage regulator according to claim 2,
wherein the reference voltage generation circuit further comprises:
a first NMOS depletion transistor, a second NMOS depletion transistor, and an NMOS enhancement transistor, each having gates connected in common,
wherein the first NMOS depletion transistor includes a drain connected to the power source and a source connected to a drain of the second NMOS depletion transistor
the second NMOS depletion transistor includes a gate and a source connected to a gate and a drain of the NMOS enhancement transistor,
the NMOS enhancement transistor includes a source grounded, and
the first reference voltage is output from the drain of the NMOS enhancement transistor, and the second reference voltage is output from the drain of the second NMOS depletion transistor and comprising the back gate voltage source.

* * * * *